United States Patent [19]
Felton et al.

[11] Patent Number: 4,758,941
[45] Date of Patent: Jul. 19, 1988

[54] MOSFET FULLBRIDGE SWITCHING REGULATOR HAVING TRANSFORMER COUPLED MOSFET DRIVE CIRCUIT

[75] Inventors: Bruce C. Felton, Saugerties; William B. McCoy, New Paltz, both of N.Y.

[73] Assignee: International Business Machines Corporation, Armonk, N.Y.

[21] Appl. No.: 115,141

[22] Filed: Oct. 30, 1987

[51] Int. Cl.[4] .......................................... H02M 7/5387
[52] U.S. Cl. ..................................... 363/132; 307/584; 363/17; 363/98
[58] Field of Search ........................... 363/17, 98, 132; 307/571, 577, 579, 582, 583, 584

[56] References Cited

U.S. PATENT DOCUMENTS 4,319,316  3/1982  Farrer et al. .......................... 363/132

FOREIGN PATENT DOCUMENTS 2647958  4/1978  Fed. Rep. of Germany ...... 363/132
25721    2/1983  Japan ................................... 307/584
58480    3/1986  Japan .
712913   1/1980  U.S.S.R. .............................. 363/132

Primary Examiner—William H. Beha, Jr.
Attorney, Agent, or Firm—Frederick D. Poag

[57] ABSTRACT

An FET full bridge regulator has a driving transformer for the gates of the power FETs of the regulator, and a driving circuit for the primary of the driving transformer, the driving circuit including a full bridge formed by first and second sets of driving FETs, each set formed by a complementary pair of FETs and being connected across the transformer, primary, one FET of each set being driven ON to together form a series of conducting paths across the primary of the transformer in the absense of driving signals.

The voltage supply for the driving FETS in the driving circuits of the primary of the driving transformer includes a resistance across which there is developed a voltage proportional to the current drawn by the driving transformer primary in each half cycle of its operation for reducing imbalance between the half cycles.

3 Claims, 10 Drawing Sheets

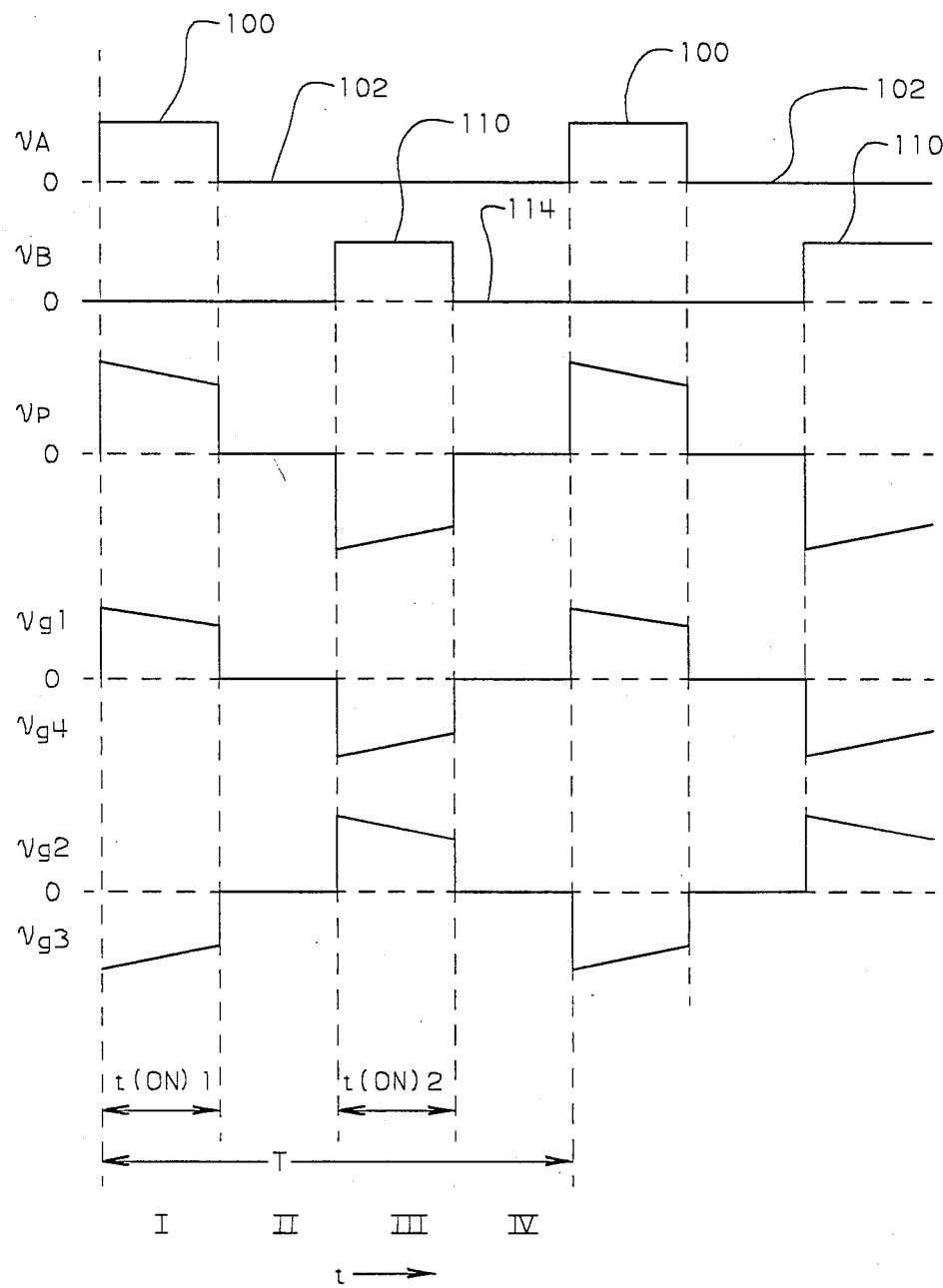

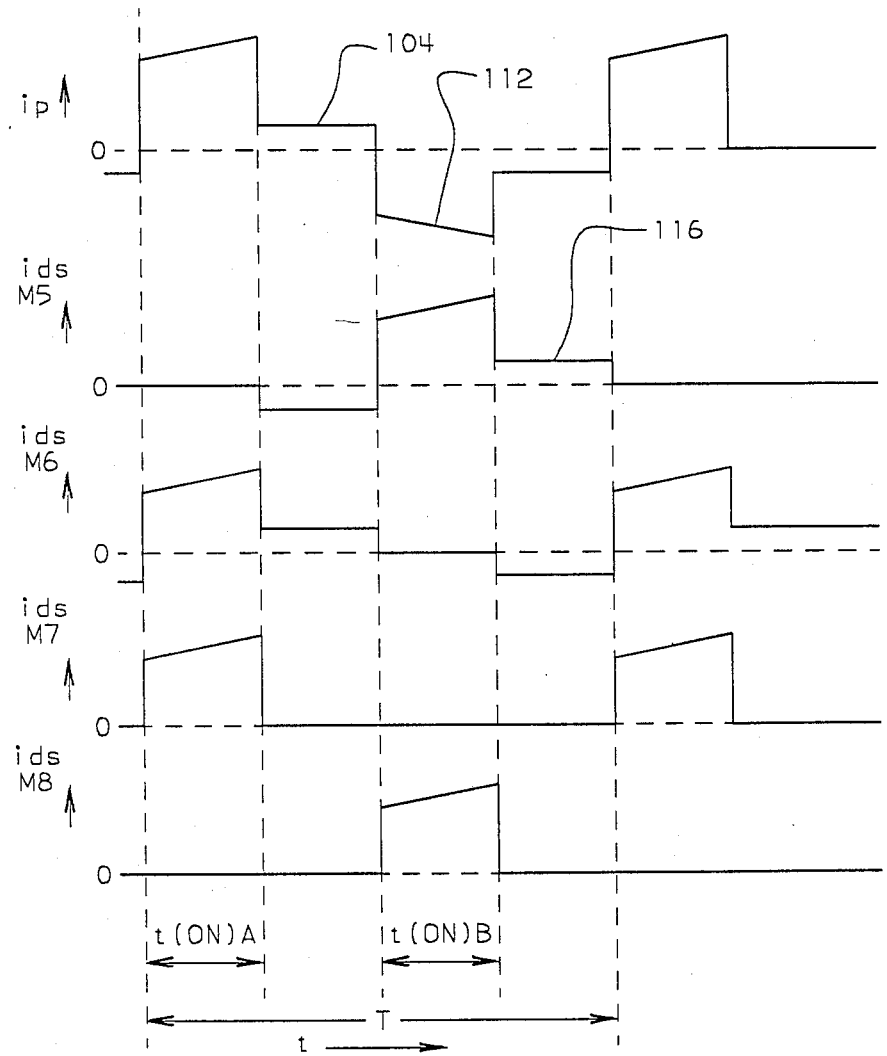

MOSFET FULLBRIDGE SWITCHING REGULATOR HAVING TRANSFORMER COUPLED MOSFET DRIVE CIRCUIT

BACKGROUND OF THE INVENTION

1. Field of the Invention

This invention relates to power supplies and more particularly to a voltage regulator having an FET inverter stage and an improved driver circuit for that stage.

2. Prior Art

One type of switching regulator which is well known in the prior art employs a full bridge topology for the inverter switches, with each of the four switching devices being driven by an isolated signal. The user of MOSFETS for these main switches allows lower drive power, but due to the desirably fast switching speeds and unavoidably relatively large input capacitance, gate voltage ringing can be a problem. Moreover, power switching circuits are often driven by transformers to provide isolation for the high voltages at reasonable cost. These transformers introduce additional inductances that make control of gate voltage very difficult. Also, the use of transformer coupling between the driver and inverter stages is accompanied by the well-known problem of transformer core "walking", that is saturation of the core due to asymmetrical operation thereof. Prior art solutions to these problems include compromises between switching frequency and the cost of special magnetics designed to reduce voltage spikes, and anti-walkng schemes which reduce efficiency, increase cost, or carry with them resident problems of their own.

SUMMARY OF THE INVENTION

It is a general object of the invention to provide an improved power supply having topological features which overcome the aforedescribed problems of the prior art in a reliable and economical manner.

These and other objects of the invention are achieved by a power supply which provides a transformer coupled drive system for an FET Bridge Regulator that shorts the transformer primary during OFF time of the main switches of the regulator. This shorting removes the effects of the large magnetizing inductance and the associated energy from the secondary circuit of the transformer. With the transformer shorted, the secondary L/C circuit, consisting of the main switch gate capacitances and the transformer leakage and wiring inductances, is much more easily damped. The drive circuit operates from two, interleaved input signals provided by regulator control circuits of the power supply. These signals may have duty cycles ranging from 0 to nearly 50%. Each input pulse produces positive gate signals to one diagonal pair of main switches and negative gate signals to the other pair. When both inputs are OFF, all main switches are biased OFF.

According to one aspect of the invention, an FET full bridge regulator has a driving transformer for the gates of the power FETs of the regulator, and a driving circuit for the primary of the driving transformer, the driving circuit comprising a full bridge formed by first and second sets of driving FETs, which include diodes for reverse, drain-source conduction, each set comprising a complementary pair of FETS and being connected across the transformer primary, one FET of each set being driven ON to together form a conducting path connecting a voltage source across the primary of the transformer and in the absence of driving signals one transistor of each pair conducts forwardly and one conducts reversely to establish a short circuit across the primary. According to still another aspect of the invention, the voltage supply for the driving FETS in the driving circuits of the primary of the driving transformer includes a resistance across which there is developed a voltage proportional to the current drawn by the driving transformer primary in each half cycle of its operation, whereby the voltage applied to that primary is reduced asymmetrically in a corrective direction when the currents drawn during the respective half cycles are not equal.

The foregoing and other objects, features and advantages of the invention will be apparent from the following specification and the drawings forming a part thereof.

BRIEF DESCRIPTION OF THE DRAWINGS

FIG. 3 is a set of curves representing drive circuit voltage wave shapes illustrative of the operation of the driver stage shown in FIG. 2.

FIG. 4 is a set of curves representative of current waveshapes in the operation of the driver stage of FIG. 1, for time periods corresponding to those of FIG. 3.

DETAILED DESCRIPTION

Figure 1:
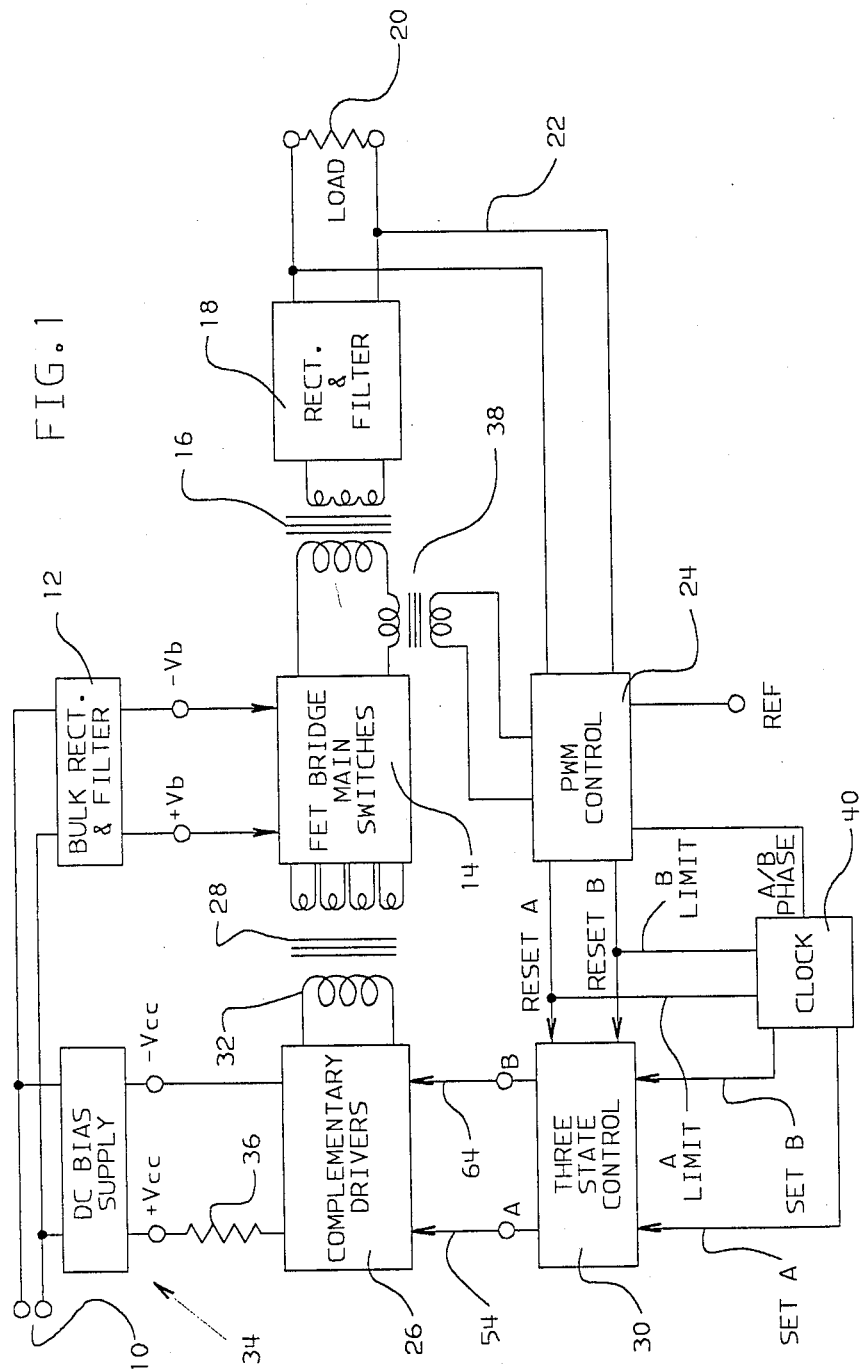
FIG. 1 is a block diagram of a power system including driver and inverter stages in accordance with the invention.

FIG. 1 shows a power supply system which in gross aspects is similar to many conventional power supply systems. That is, energy derived from an A.C. Source 10 is rectified and filtered at 12 and the resulting D.C. is chopped by switches 14 into pulses which are delivered via power transformer 16 to a rectifier and filter arrangement 18 which delivers regulated and smoothed D.C. to the useful load 20. Typically, in such a system, regulation is achieved by a feedback loop 22 including a pulse width modulation control 24 by which the drive circuits 26 of the main switches 14 are operated in such manner as to vary the width of the pulses delivered to 16 in a manner to compensate for error detected by the loop 22 at the terminal supplying the load 20.

In the system shown, the main switches comprise a bridge arrangement of field effect transistors (FETS) driven via a transformer 28, and the drivers 26 are arranged in a circuit whereby they respond to a three-state control 30 in accordance with the invention to drive the primary 32 of transformer 28 in opposite directions with deadtimes therebetween during which the primary 32 is short-circuited. Also, in accordance with the invention, the complementary drivers 26 are energized via a source 34 which includes means such as a resistor 36 operable to apply voltages to the drivers in accordance with an inverse function of their respective current loads.

The pulse width modulation control 24 in the illustrated embodiment utilizes a ramp signal derived from a current transformer 38 in series with the primary of the power transformer 16. The ramp signal is compared with an error signal, developed by comparing the output DC voltage detected by 22, to yield a Reset A or Reset B signal as determined by an A/B phase signal emitted by a clock unit 40. Clock 40 also provides A Limit and B Limit signals which act as supplementary A Reset and B Reset controls. Clock 40 also provides Set A and Set B signals to the three State Control 30. That Control 30 comprises latches which are set and reset to yield signals A and B as will be described.

Figure 2:
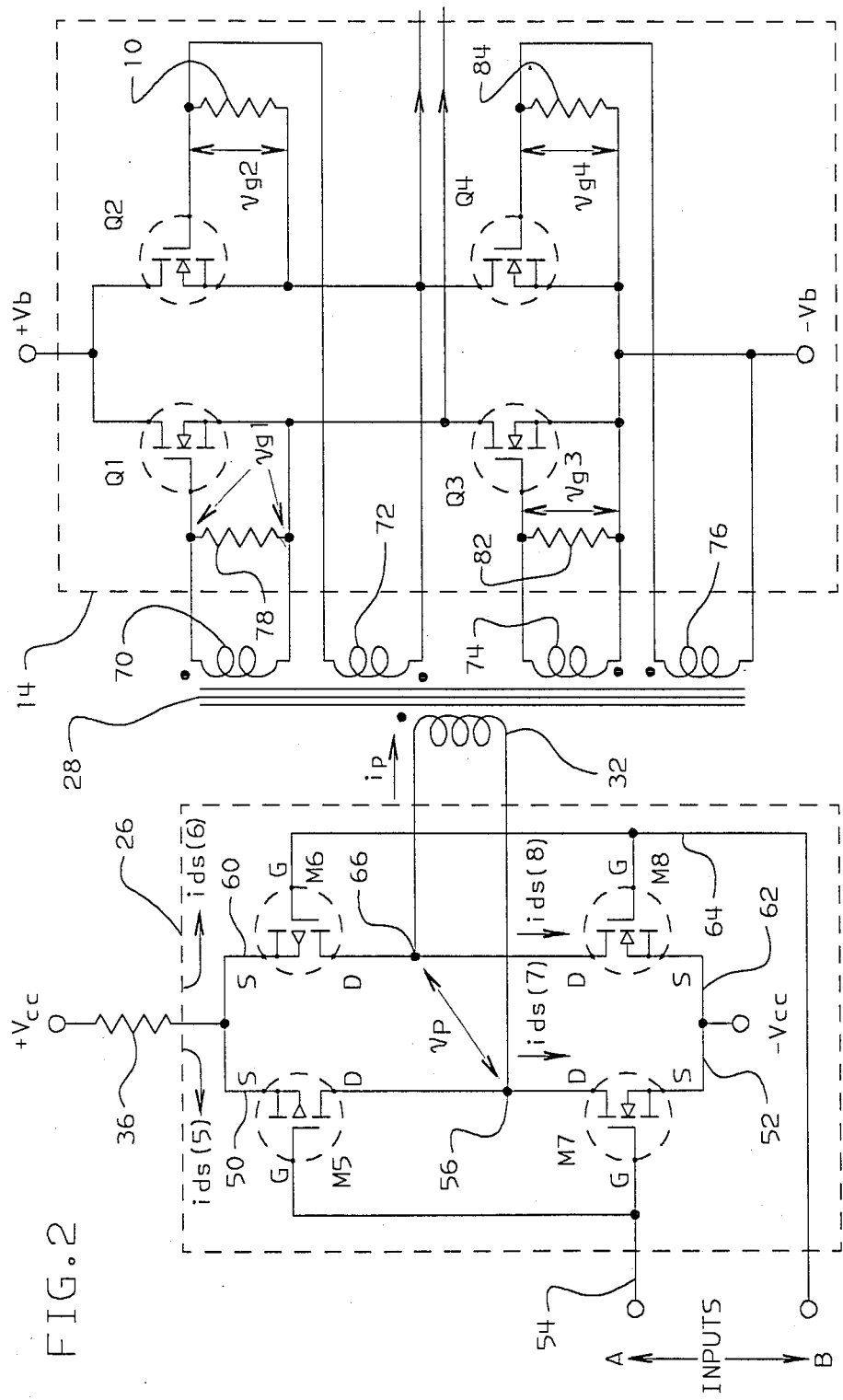
FIG. 2 is a simplified circuit diagram of the driver and inverter stages of the power system of FIG. 1.
Figure 5A:
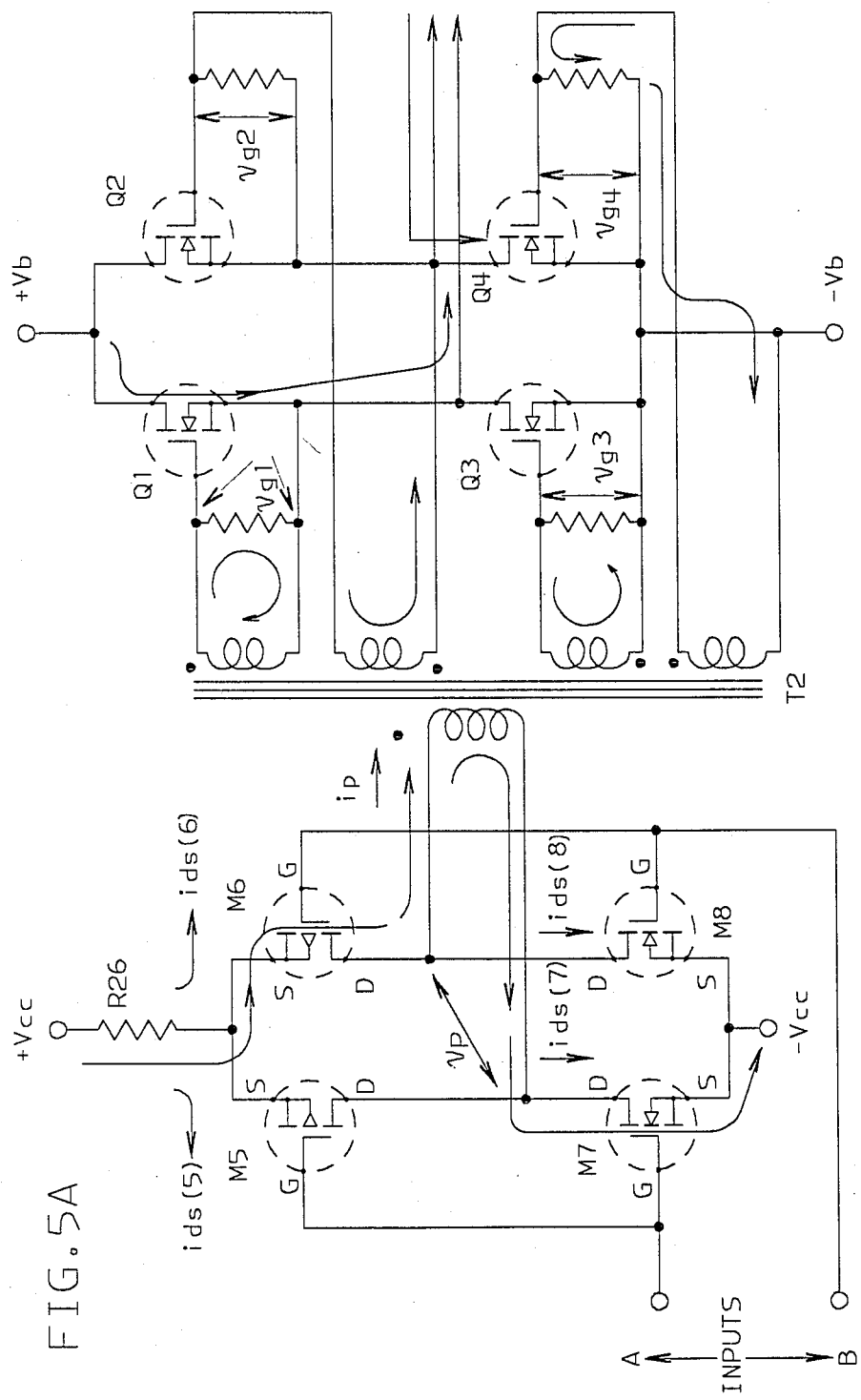
FIGS. 5a thru 5d, show paths of control current and load current during periods "I" through "IV" of the operation as shown in FIGS. 3 and 4.
Figure 5B:
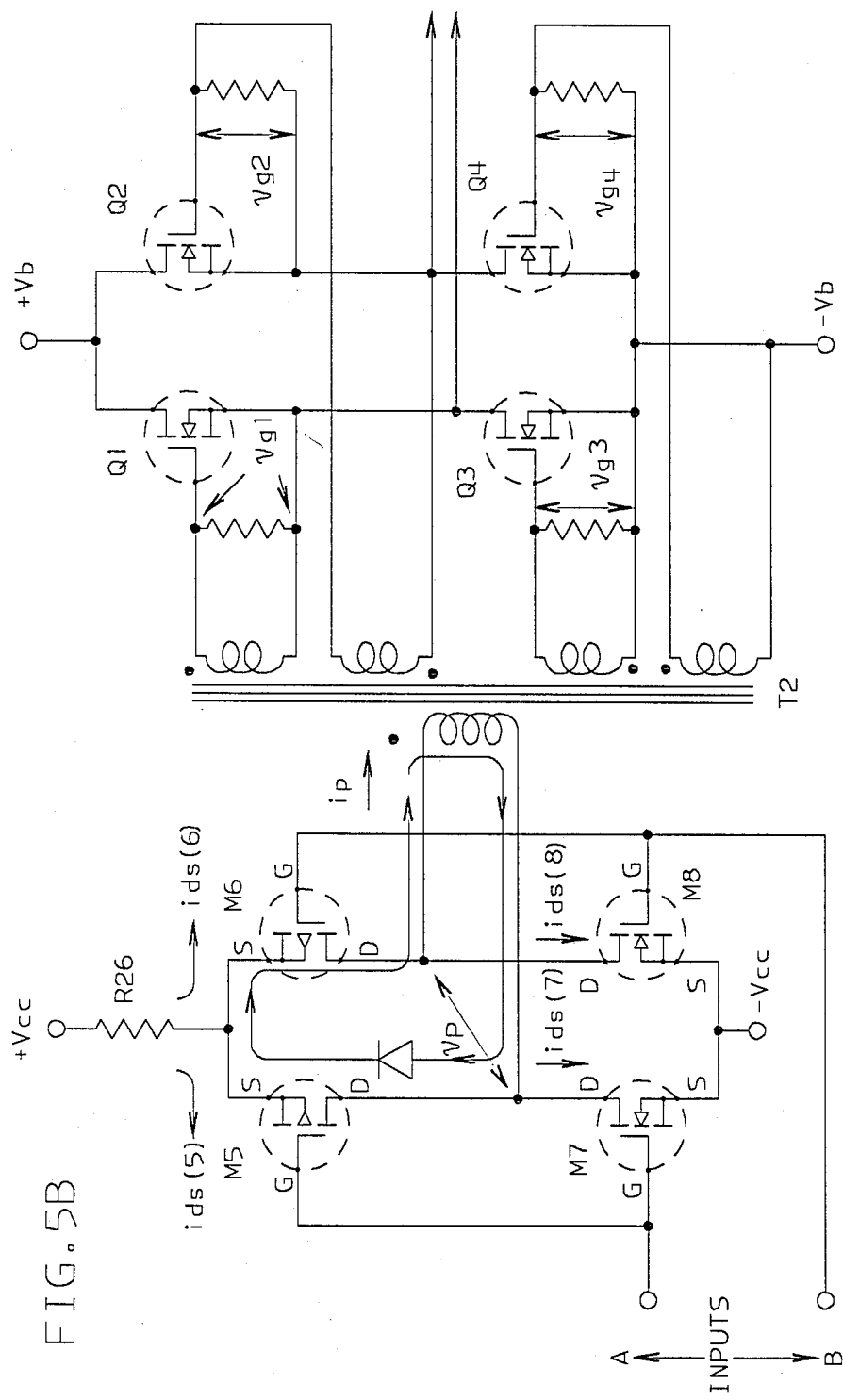
Figure 5C:
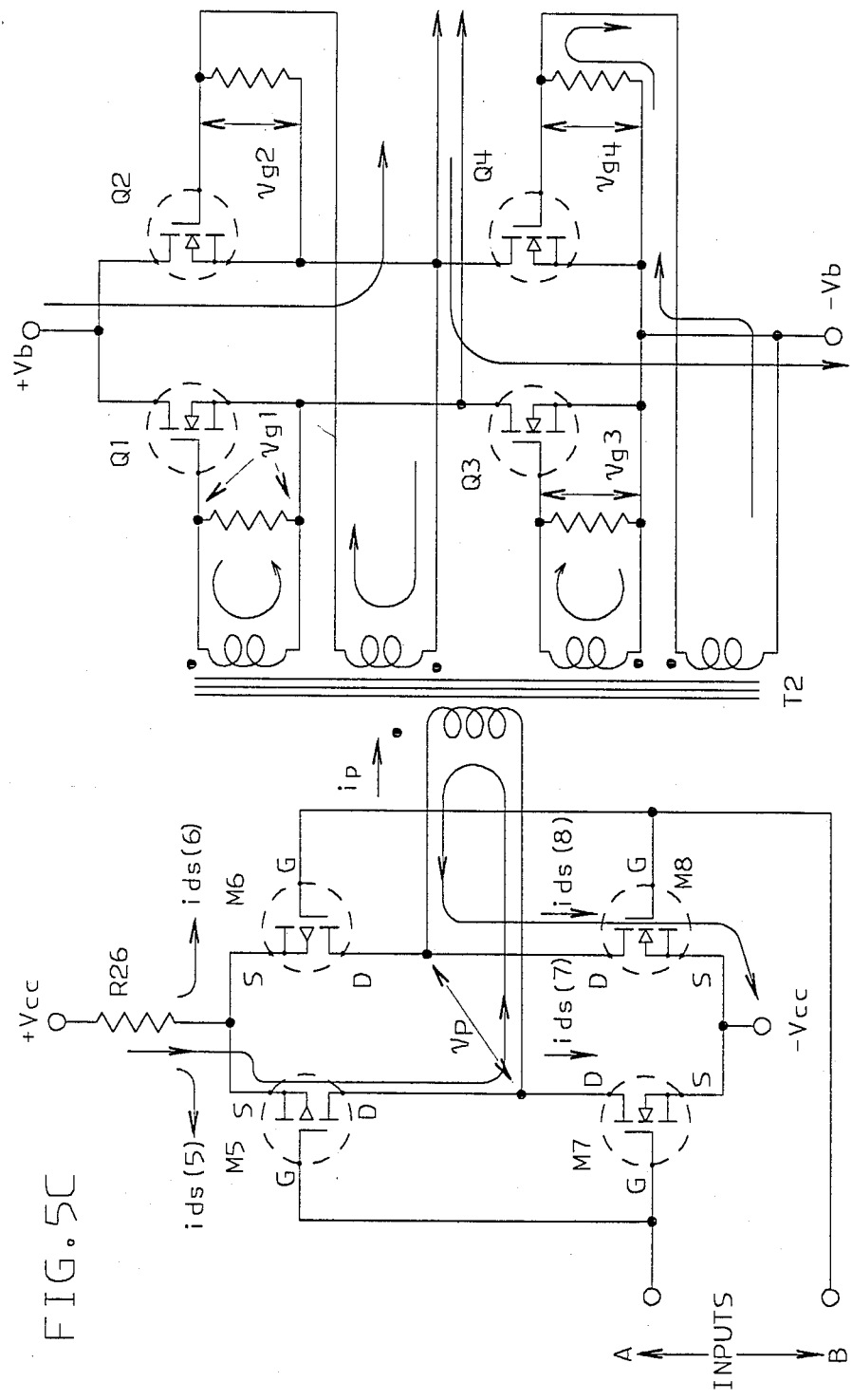
Figure 5D:
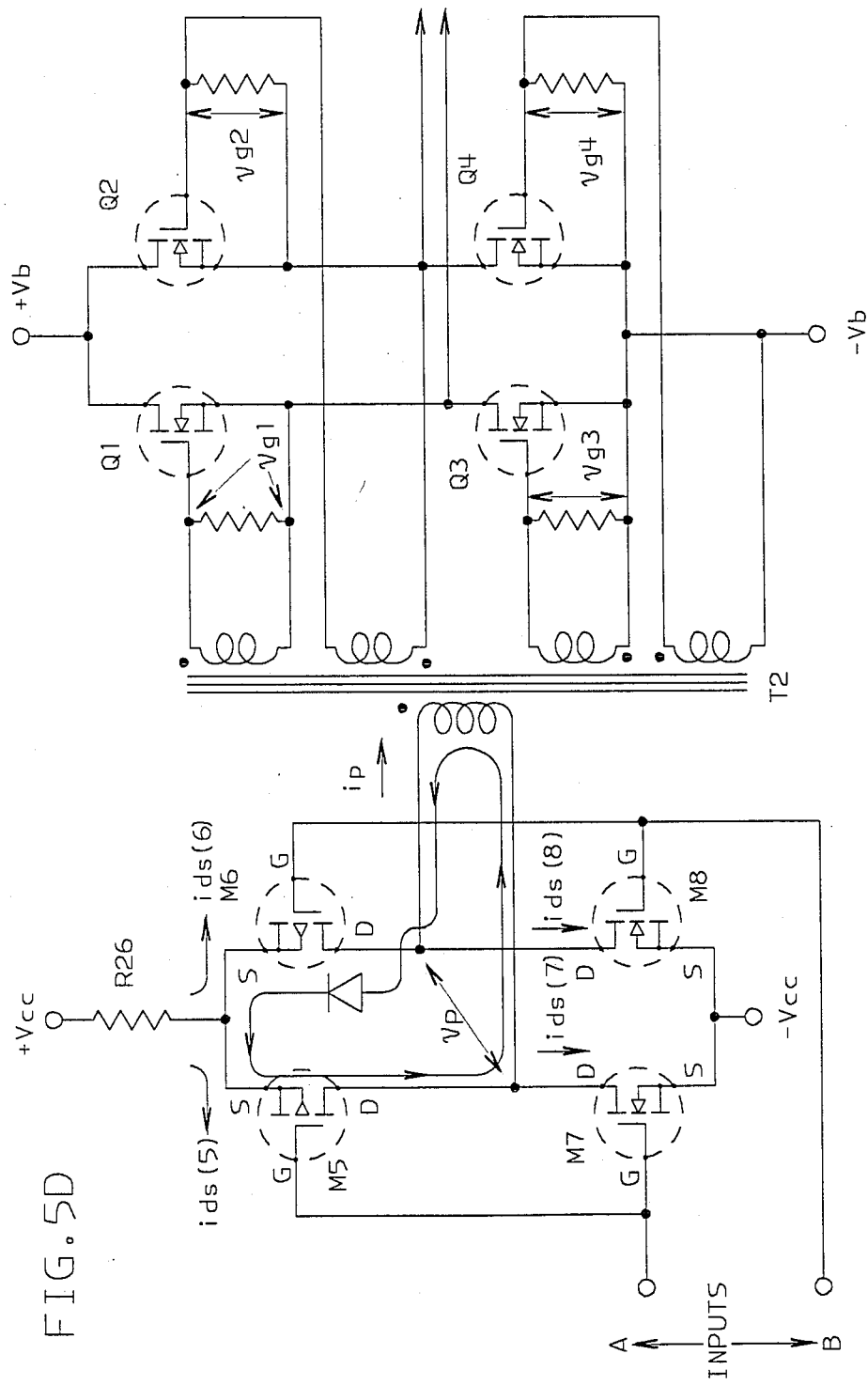

FIG. 2 shows simplified circuit diagrams illustrative of a preferred embodiment of the drive 26 and main swtich 14 sections of the power supply of FIG. 1.

The circuit arrangement showsn in FIG. 2 uses four small, low voltage MOSFET's M5, M6, M7, M8, the single drive transformer 28, and five resistors 78, 80, 82, 84, and 36 to achieve the overall function when operated by the signals A and B from the three state control 30 of FIG. 1.

Transistor M5 is a P-channel device the source S of which is referenced via conductor 50 to +Vcc less any drop across resistor 36, and transistor M7 is an N channel device the source S of which is referenced to −Vcc via conductor 52. the gates G of transistors M5 and M7 are connected together and via conductor 54 to control input A of the three state control 30 (FIG. 1). The drains D of transistors M5 and M7 are connected together and to one terminal 56 of the primary 32 of the driver transformer 28.

The control signal applied at terminal A by the three state control 30 is referenced to a "zero" volt level equal to −Vcc so that when the signal at terminal A is up (positive) transistor M5 is OFF and transistor M7 is ON, thereby disconnecting terminal 56 from conductor 50 and +Vcc and connecting terminal 56 to conductor 52 and −Vcc.

Transistor M6 is a P channel device the source S of which is referenced via conductor 60 to +Vcc less any drop across resistor 34, and transistor M8 is an N channel device the source S of which is referenced to −Vcc via conductor 62. The gates G of transistors M6 and M8 are connected together and via conductor 64 to control input B of the three state control 30 (FIG. 1). The drains D of transistors M6 and M8 are connected together and to the other terminal 66 of the primary 32 of the driver transformer 28.

The control signal applied at terminal B by the three state control 30 is referenced to the same "zero" level equal to −Vcc as is the above described "A" signal, so that when the signal at terminal B is up (positive) transistor M6 is OFF and transistor M8 is on, thereby disconnecting terminal 66 from conductor 60 and +Vcc and connecting terminal 66 to conductor 62 and −Vcc.

When the signal at terminal A is down (zero), the gate G of transistor M5 is at −Vcc turning M5 ON, and the gate G of transistor M7 is at approximately the same potential as its source S, depriving M7 of gate drive and turning transistor M7 OFF. Similarly, when the signal at terminal B is down, transistor M6 is ON and transistor M8 is OFF.

FIG. 2 also shows a basic embodiment of the main switch stage 14 in accordance with the invention. Four MOSFET transistors Q1, Q2, Q3, Q4 are connected in a full bridge configuration to gate pulses of current from the +VB terminal of bulk DC source 12 to the main power transformer 16. Gate drive for the main switch transistors Q1, Q2, Q3, Q4 is provided by respective secondaries 70, 72, 74, 76 of driver transformer 28 in response to energization of primary 32 of that transformer, as will be described. Additionally, resistors 78, 80, 82, 84 are provided across the respective drive secondaries 70, 72, 74, 76; that is, between the source and gate terminals of the respective main transistor switches Q1, Q2, Q3, Q4.

Circuit operation will now be described with the aid of waveshapes shown in FIG. 3 and 4, and the current paths illustrated in FIGS. 5a through 5d. Inputs V(a) and V(b) are the signals from the control circuit terminals A and B, FIGS. 1 and 2. These signals are alternately ON positive, have essentially equal ON times and equal timing between the beginning of each pulse. When V(a) is positive, as shown at 100, FIG. 3, drive swtich M7, FIG. 2, is ON and M5 is OFF. M6 will be ON due to the zero level of V(b) which is negative relative to the source terminal S of M6. This results in a positive primary voltage V(p) at terminal 66 relative to terminal 56, and positive gate signals to main switch transistors Q1 and Q4. The other two main switches (Q2 and Q3) will have negative gate voltages as indicated by the dotting on secondaries 72 and 74, and hence will be OFF. The drive transformer 28 will have a primary current I(p), FIGS. 2 and 4, as a result of reflected load current in resistors 78, 80, 82, 84, and due to magnetizing current in transformer 28.

When V(a) returns to zero, as shown at 102, FIG. 3, M7 will turn OFF and M5 will turn ON. M6 remains ON. V(p) and all main gate signals from secondaries 70, 72, 74, 76 now drop to zero, stopping conduction in all main switches Q1, Q2, Q3, Q4. The magnetizing current established in transformer 28 during the ON time must continue to flow. This current, shown at 104, FIG. 4, will flow through transistors M5 and M6 resulting in an effective short-circuit on the primary winding 32. This shorted primary condition is reflected to the secondaries 70, 72, 74, 78 as a low impedance across all gate-source terminals of the main switches Q1, Q2, Q3, Q4, holding them OFF.

When V(b) at terminal B, FIGS. 1 and 2, goes positive as shown at 110, FIG. 3, circuit operation is reversed. M6 turns off, M8 turns on, V(p) is negative an i(p) through primary 32 reverses as shown at 112, FIG. 4. Main switches Q2 and Q3 now conduct. The magnetizing current in 28 decreases and reverses. When V(b) returns to zero, as shown at 114, FIG. 3, M8 turns OFF, M6 turns ON, and the reversed magnetizing current, shown at 116, FIG. 4, flows in M5 and "backwards" through M6. The shorted primary condition is established again and all main switches Q1, Q2, Q3, Q4 are held off.

FIGS. 5a—5d trace the current flow in portion I, II, III, IV of the above described cycle of operation. These figures relate to the voltage and current curves of FIGS. 3 and 4 in accordance with the portions I, II, III, IV delineated thereon.

If the ON (i.e., up) times of V(a) and V(b) are equal, the magnetizing current and core flux of drive transformer 28 will center around zero. Hence, the peak flux in transformer 28 will be one half of the total flux excursion. If the A and B signals from the control circuits do not have exactly the same ON time, "core walking" or asymmetrical magnetic cycling of the core of transformer 28 may result, leading to non-symmetrical magnetizing current. Under these conditions, the voltage drop across resistor 36, FIGS. 1 and 2, during the ON times of signals A and B will be different, tending to reduce the voltage on primary 32 of transformer 28 during the longer ON time and to increase the primary voltage for the shorter ON time. Volt-time unbalance on transformer 28 is thus limited by the drop across resistor 36. Resistor 36 also serves to limit the peak current in the drive switches which occurs when M5 and M7 (or M6 and M8) conduct simultaneously during the transistions of V(a) (or V(b)). Although the internal resistances of M5, M6, M7 and M8 also contribute to the peak current limiting and transformer anti-walking, the external resistor 36, which has a value significantly greater than the operating internal resistance of the MOSFETS M5 through 8, predominates in this effect and does not limit the magnetizing currents 104, 116 during OFF times of the drive control.

Figure 6:
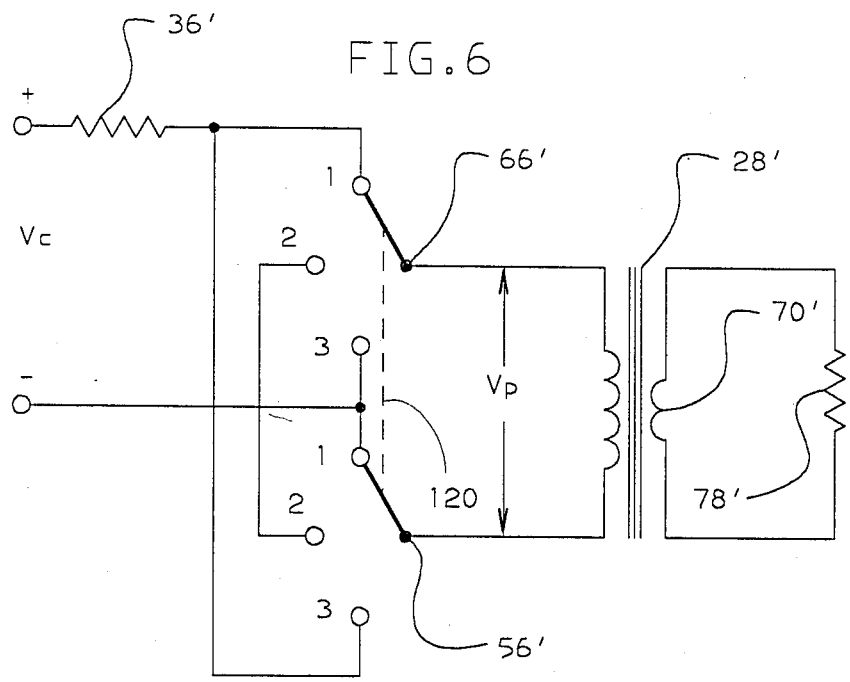
FIG. 6 shows a simplified equivalent circuit representative of principles involved in the operation of the circuit of FIG. 2.
Figure 7:
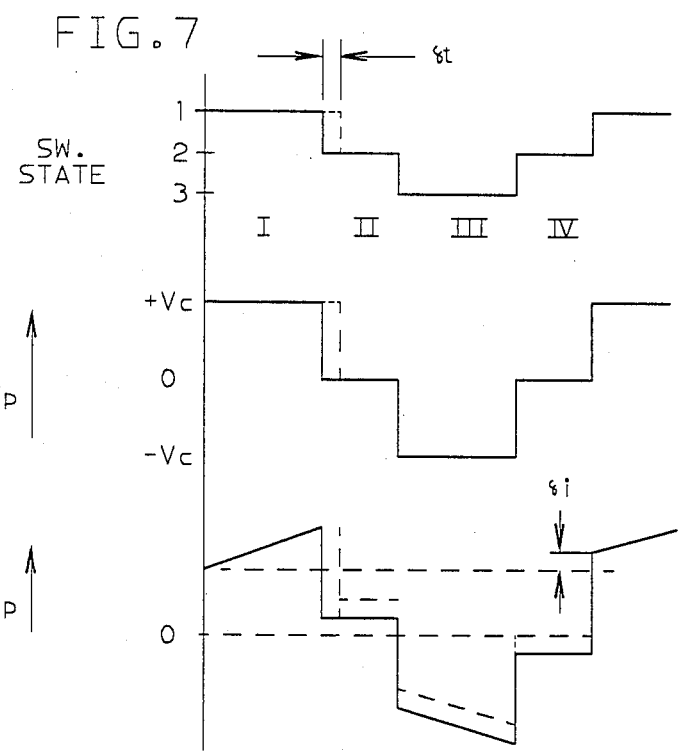
FIG. 7 shows a set of curves illustrative of the "walking" problem solved in accordance with an aspect of the invention.

FIGS. 6 and 7 summarize the operation of driver section 26 of FIGS. 1 and 2. Transistors M5, M6, M7, and M8 of FIG. 2 are represented by a double pole, triple throw switch 120, each pole having three positions 1, 2, 3. Position 1 corresponds to the A, not B input condition; position 2 to not A, not B condition; and position 3 to the B, not A condition. In the position 1 shown, conventional current flows from +Vcc through balancing resistor 36' to primary 32' terminal 66', through 32' to primary terminal 56', to −Vcc. This state is represented at portion I of the family of curves of FIG. 7. Switch position 2 corresponds to portions II and IV of FIG. 7, and swtich position 3 corresponds to portion III of FIG. 7.

As shown in solid line in FIG. 7 during state or curve portions I and III current ip through primary 32' should be mirror images of each other. Core 28' "walks", if a shift, delta t, occurs in Vp and ip as shown in dotted line. However, this undesirable condition is corrected by the differential voltage drop in balancing resistor 36'. When the primary current during operation portion I starts to exceed its norm, as shown at delta i, curve portion I, the drop across resistor 36' reduces Vp by delta i times the resistance value of 36', thereby reducing vp during that portion I of the operation so as to bring the operation back into balance or at least restrain it from further drift from balance.

The values of resistors 78, 80, 82, 84 are dictated by the amount of damping required in the secondary circuits driven by transformer 28. The critical time occurs at the end of the ON time when gate signals of two of the main switches Q1, Q4 or Q2, Q3 fall, initiating turn-off. Gate signals to the other main switches go from a negative voltage to zero and, in fact, overshoot positive due to leakage inductance of transformer 28 and gate capacitance of the main switches Q1–Q4. If turn-off of the ON main switches Q1, Q4, or Q2, Q3 is slow and the positive overshoot exceeds the threshold voltage on the OFF devices, both main switches Q1, Q3 or Q2, Q4 on one "leg" of the bridge conduct forming a short circuit across V(b). The values of resistors 78, 80, 82, 84 must be reduced to limit this overshoot to voltages less than the main switch turn-on threshold voltage.

Figure 8:
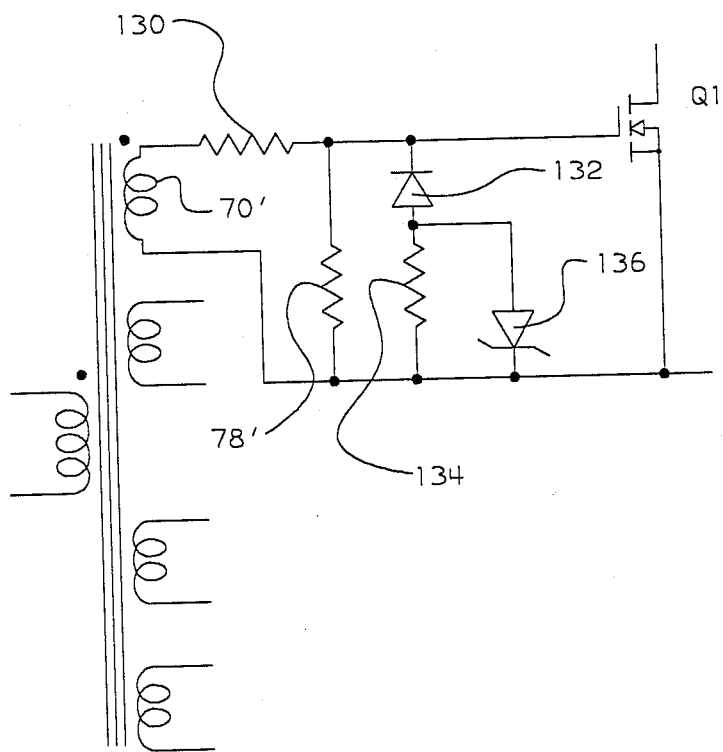
FIG. 8 shows a fragmentary detail showing an alternative embodiment of the damping network connected to the gate drives of the main switch scheme of FIG. 2.

Reducing the values of 78, 80, 82, 84, however, increases the primary current and power dissipation in drive switches M5, M6, M7, M8 and all resistors. An alternative approach to provide damping of the main gate signals is to introduce series resistors 130 as shown in FIG. 8. For the usual range of leakage inductance and gate capacitance encountered, small values of series resistance have a major impact on circuit damping. Hence, the positive overshoot problem can be controlled without significant increase in primary current and overall power dissipation.

The drive circuit must also content with transient voltages produced by drain voltage excursions of the main switches Q1–Q4. Of particular interest is the negative excursion on the drain of a main switch caused by switching of the other device in the same leg. This occurs at nearly the same time as the positive overshoot discussed above. The effect is to produce a negative "spike" on the gate due to coupling through the drain-gate capacitance. The amplitude of this spike must be limited to values less than the gate-source voltage rating. Reducing the values of resistors 78, 80, 82, 84, will reduce the amplitude of this spike but at the same "cost" as above—i.e., increased primary current and overall power dissipation. Note that the introduction of the series resistors alone will increase the spike amplitude.

Also shown in FIG. 8 are additional elements comprising an alternative circuit to limit the spike voltage. A clipping network composed of a diode 132, resistor 134 and zener diode 136 may be added to each main switch gate circuit (Q1 is shown) which will "clip" the negative spike at approximately the zener voltage. This voltage would be selected to be greater than the normal drive voltages but well below the gate-source voltage rating. During positive gate pulses, diode 132 blocks. During negative gate pulses, diode 132 conducts, allowing zener diode 136 to clip the voltage.

Specific designs may, or may not, require the series resistor and/or clipping circuitry, dependent on transformer leakage, MOSFET gate characteristics, and wiring parasitics or trade-off's of circuit complexity vs. control bias power and overall power dissipation may favor the use of one or both of these alternative circuits.

In the foregoing, a current mode control of the ON times of the A and B signals is achieved by use of ramp signals derived by means of the current transformer 38 from the current in the primary of the power transformer 16, in other words, the main switch current rises as energy is delivered to inductance in the output filter of section 18 during the A and B ON times. Alternatively, this ramp function could be provided by a saw tooth generator in the control 24. Both control schemes are well-known. Moreover, the drive circuit 26 may be adapted to provide the drive function in other regulator topologies such as dual switch, half bridge, and push-pull configurations. Also, alternate connection of the P and N channel drive switches is possible and still achieve equivalent operation. Accordingly, although one main embodiment of the invention has been shown and described in detail, it will be apparent that the invention is not limited thereto, but could be otherwise embodied within the spirit of the invention and the scope of the appended claims.

What is claimed is:

1. A power supply including a main switch section comprising a bridge arrangement of field effect transistors, a transformer connected to drive the gates of said transistors and drive means connected to a primary winding of said transformer comprising a three-state control to drive the primary of said transformer alternatively opposite directions with deadtimes therebetween and to short circuit said primary during said deadtimes.

2. FET Full bridge regulator comprising a driving transformer for the gates of the power FETs of the regulator, and a driving circuit for the primary of the driving transformer, said driving circuit comprising:
  a voltage source,
  a full bridge formed by first and second sets of driving FETs, each said set comprising a complementary pair of FETs having reverse current carrying capability and being connected across the transformer primary, one FET of each set being driven ON to together form a conducting path connecting said voltage source across the primary of the transformer and in the absence of driving signals one transistor of each pair conducting forwardly and one conducting reversely to establish a short circuit across said primary.

3. A regulator in accordance with claim 2, further comprising a voltage supply for the driving FETs in the driving circuits of said primary of said driving transformer, said supply including a resistance across which there is developed a voltage proportional to the current drawn by the driving transformer primary in each half cycle of its operation, whereby the voltage applied to that primary is reduced asymmetrically in a corrective direction when the currents drawn during the respective half cycles are not equal.

* * * * *